United States Patent [19]

Jain

[11] Patent Number: 4,949,136
[45] Date of Patent: Aug. 14, 1990

[54] SUBMICRON LIGHTLY DOPED FIELD EFFECT TRANSISTORS

[75] Inventor: Faquir C. Jain, Storrs, Conn.

[73] Assignee: University of Connecticut, Storrs, Conn.

[21] Appl. No.: 204,578

[22] Filed: Jun. 9, 1988

[51] Int. Cl.$^5$ ............................................. H01L 29/78
[52] U.S. Cl. .................................. 357/23.3; 357/23.4; 357/23.8; 357/23.9; 357/42
[58] Field of Search ..................... 357/23.3, 42, 23.4, 357/23.8, 23.9

[56] References Cited

U.S. PATENT DOCUMENTS

| | | | |
|---|---|---|---|
| 4,769,686 | 9/1988 | Horiuchi et al. | 357/23.3 X |
| 4,771,014 | 9/1988 | Liou et al. | 357/23.3 X |
| 4,784,965 | 11/1988 | Woo et al. | 357/23.3 X |
| 4,818,719 | 4/1989 | Yeh et al. | 357/42 X |

FOREIGN PATENT DOCUMENTS

| | | | |
|---|---|---|---|
| 59-195869 | 11/1984 | Japan | 357/23.3 |
| 61-105868 | 5/1986 | Japan | 357/23.3 |
| 62-274780 | 11/1987 | Japan | 357/23.3 |

OTHER PUBLICATIONS

Balasubramanyam, K. et al, "Characterization of As-P Double-Diffused Drain Structure", IEDM 84, pp. 782-785.
Fu-Chieh Hsu, John Hui and Kuang Yi Chiu, "Hot-Electron Degradation in Submicron VLSI", IEDM Tech. Digest, p. 48 (1985).
Tiao yuan Huang, William W. Yao, Russel A. Martin, Alan G. Lewis, Mitsumasa Koyanagi and John Y. Chen; "A Novel Submicron LDD Transistor with Inverse-T Gate Structure", IEDM Tech. Digest, p. 742, (1986).
James S. Ni, "Modeling of Hot Electron Effects on the Device Parameters for Circuit Simulation", IEDM, p. 738 (1986).
S. Baba, A. Kita and J. Ueda, "Mechanism of Hot Carrier Induced Degradation in MOSFET's", IEDM, p. 745 (1986).
T. Noguchi, Y. Asahi, N. Ikeda, K. Maeguchi and K. Kanzaki, "Parasitic Resistance Characterization for Optimum Design of Half Micron MOSFETs," IEDM, p. 730, (1986).
Y. Hiruta, K. Maeguchi and K. Kanzaki, "Impact of Hot Electron Trapping on Half Micron PMOSFETS with P+ Poly Si Gate", IEDM, p. 718, (1986).
Paul J. Tsang, Seiki Ogura, William W. Walker, Joseph F. Shepard and Dale L. Critchlow, "Fabrication of High-Performance LDDFET's with Oxide Sidewall-Spacer Technology", IEEE Trans. on Elect. Dev., vol. ED-29, Nov. 1982, p. 590.
Seiki Ogura, Paul J. Tsang, William W. Walker, Dale L. Critchlow and Joseph F. Shepard, "Design and Characteristics of the Lightly Doped Drain-Source (LDD) Insulated Gate Field-Effect Transistor", IEEE Trans. on Elect. Dev. vol. ED-27, p. 1359, (1980).
A. Ochoa, W. Dawes and D. Estreich, "Latch-Up Control in CMOS Integrated Circuits", IEEE Trans. in Nuclear Sci., vol. NS-26, No. 6, p. 5065 (1979).
Ronald R. Troutman, Michael J. Hargrove, "Transmission Line Modeling of Substrate Resistances and CMOS Latchup", IEEE.

(List continued on next page.)

Primary Examiner—Edward J. Wojciechowicz
Assistant Examiner—Sara W. Crane

[57] ABSTRACT

A lightly doped field effect transistor has a central gate portion and source and drain portions spaced to opposite sides thereof and each having a heavily doped contact section and a sidewall spacer portion between the gate portion and contact section. Each of the source and drain portions also has a lightly doped sheath with a first portion extending to a first depth about the sides of and below the contact section, and an extension of lesser depth extending under the spacer portion to the gate portion, thus providing a stepped configuration for the sheath in cross section. The sheaths have an impurity doping concentration which is $10^2$-$10^4$ lower than the impurity doping concentration in the contact sections.

6 Claims, 2 Drawing Sheets

OTHER PUBLICATIONS

A. Ochoa, Jr., P. V. Dressendorfer, "A Discussion of the Role of Distributed Effects in Latch-Up", IEEE Trans of Nuclear Sci., vol. NS-28, No. 6, p. 4992 (1981).

Bruno Ricco, Enrico Sangiorgi and Guido Ferriani, "High Holding Voltage C-MOS Technology with Lightly Doped Source and Drain Regions", IEEE, Trans of Electron Dev., vol. ED-34, No. 4, p. 810 (1987).

J. E. Schroeder, A. Ochoa, Jr. and P. V. Dressendorfer, "Latch-Up Elimination in Bulk CMOS LSI Circuits", IEEE Trans on Nuclear Sci., vol. NS-27, No. 6, p. 1735 (1980).

Eiji Takeda, Hitoshi Kume, Yoshinobu Nakagome, Tohachi Makino, Akihiro Shimizu and Shojiro Asai, "An AS≡P (n+−n−) Double Diffused Drain MOSFET for LVSI's", IEEE Trans. Electron Devices, ED 30, pp. 652–657, Jun. 1983.

Eiji Takeda, Hitoshi Kume, Toru Toyabe and Shojiro Asai, "Submicrometer MOSFET Structure for Minimizing Hot-Carrier Generation", IEEE Trans. Electron Devices, ED-29, pp. 611–618, Apr. 1982.

Eiji Takeda, Akihiro Shimizu, Hitoshi Kume and Kiyoo Itoh, "A Role of Source n− Region in LDD MOSFET's", IEEE Tran. Electron Devices, ED-33, pp. 869–870 (1986).

M. Koyanagi, A. G. Lewis, J. Zhu, R. A. Martin, T. Y. Huang and J. Y. Chen, "Investigation and Reduction of Hot Electron Induced Punchthrough (Heip) Effect in Submicron PMOSDETS", IEDM Tech. Digest, pp. 722–725 (Dec. 1986).

Christopher F. Codella and Seiki Ogura, "Halo Doping Effects in Submicron DI-LDD Device Design", IEDM Tech. Digest, 230 (Dec. 1985).

Hussein I. Hanafi, "Mosfet Over DD MOSFET", IEEE Circuits and Devices Magazine, pp. 13–15, (Nov. 1985).

Kuo-hua Lee, B. R. Jones, C. Burke, L. V. Tran, J. A. Shimer and M. L. Chen, "Lightly Doped Drain Structure for Advanced CMOS (Twin-Tub IV)," IEDM Tech. Digest, pp. 242–245 (Dec. 1985).

Chenming Hu, "Hot-Electron Effects in MOSFET's", IEDM Tech Digest, pp. 176–179 (Dec. 1983).

Fang-Shi J. Lai, L. K. Wang, Yuan Taur, Jack Yuan-Chen Sun, Karen E. Petrillo, Susan Kane Chicotka, Edward J. Petrillo, Michael R. Polcari, Thomas J. Bucelot and D. S. Zicherman, "A Highly Latchup-Immune 1-$\mu$m CMOS Technology Fabricated with 1-MeV Ion Implantation and Self-Aligned TiSi$_2$", IEEE Trans. Electron Dev. ED. 33, pp. 1308–1319, (Sep. 1986).

Ronald R. Troutman, "VLSI Limitations from Drain-Induced Barrier Lowering", IEEE Trans. Electron Devices, ED-26, pp. 461–468 (1979).

T. Mizuno, J. Kumagai, Y. Matsumoto, S. Sawada and S. Shinozaki, "New Degradation Phenomena by Source and Drain Hot-Carriers in Half-Micron P-MOSFETS", IEDM Tech. Digest, pp. 726–729 (1986).

Ching-Yeu Wei, J. M. Pimbley and Y. Nissan-Cohen, "Buried and Graded/Buried LDD Structures for Improved Hot-Electron Reliability", IEEE Electron Device Letters, EDL 7, pp. 380–382, (1986).

Fu-Chieh Hsu, Ping-Keung Ko, Simon Tam, Chenming Hu, and Richard S. Muller, "An Analytical Breakdown Model for Short-Channel MOSFET's", IEEE Trans. Electron Devices ED-29, pp. 1735–1740 (1982).

Tiao-Yuan Huang, William W. Yao, R. A. Martin, A. G. Lewis, M. Koyanagi and J. Y. Chen, "A New LDD Transistor with Inverse-T Gate Structure", IEEE Electron Device Letters, EDL 8, pp. 151–153 (1987).

SUBMICRON LIGHTLY DOPED FIELD EFFECT TRANSISTORS

BACKGROUNDD OF THE INVENTION

Double-diffused drain (DD) and lightly-doped drain (LDD) structures have been proposed during the past few years to improve the high-field effect characteristics of submicron MOSFETs. Compairsions of DD and LDD devices have been made by several investigators who have analyzed advantages and disadvantages of each. A variety of structural configurations for LDDFETs have been proposed and fabricated.

It is an object of the present invention to provide a novel field effect transistor in which highly-doped depending source and drain regions are provided with lightly-doped sheaths.

It is also an object to provide such a transistor which may be readily fabricated and which provides latchup suppression and improved high field effects.

SUMMARY OF THE INVENTION

It has now been found that the foregoing and related objects may be readily attained in a silicon field effect transistor having a central gate portion, a source portion to one side of the gate portion and having a heavily doped depending contact section. The source portion also has a lightly doped sheath about the heavily doped depending contact section. A drain portion is spaced to the opposite side of the gate portion and a heavily doped depending contact section are lightly doped sheath about the heavily doped depending contact section.

DETAILED DESCRIPTION OF THE ILLUSTRATED EMBODIMENT

Figure 1:
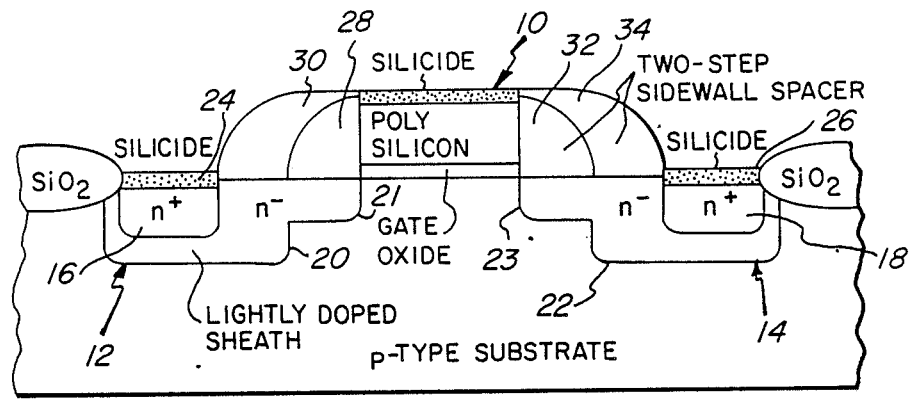
FIG. 1 is a diagrammatic view of a field effect transistor embodying the present invention.

Turning now in detail to FIG. 1, therein illustrated is a field effect transistor embodying the present invention. The structure has the central gate portion generally designated by the numeral 10 and comprised of the base of silicon dioxide, the polysilicon deposit, and the overlaying silicide contact deposit.

The source portion is generally designated by the numeral 12, and the drain portion is generally designated by the numeral 14. Both portions 12, 14 are similarly constructed, and they depend along the opposite sides of the gate portion 10. As seen, they have a highly doped section 16, 18 spaced outwardly from the gate portion 10, and a sheath 20, 22 which encases the bottom and sides of the section 16, 18. Overlaying the highly doped section 16, 18 is a silicide contact 24, 26.

The sheaths 20, 22 extend to the gate portion 10, and they underlie in part the sidewall spacers 28, 30, 32, 34. As can be seen, the sheaths 20, 22 extend about and below the contact sections 16, 18 at which they are of a first depth. They have extensions 21, 23 under the sidewall spacers 28, 32 which extend to the gate portion 10, and these extensions 21, 23 a lesser depth to provide the sheaths 20, 22 a stepped configuration in cross section. The lightly doped sheaths 20, 22 of the present invention have an impurity concentration which is $10^2$ to $10^4$ less than the impurity concentration of the contact sections 16, 18.

Figure 2:
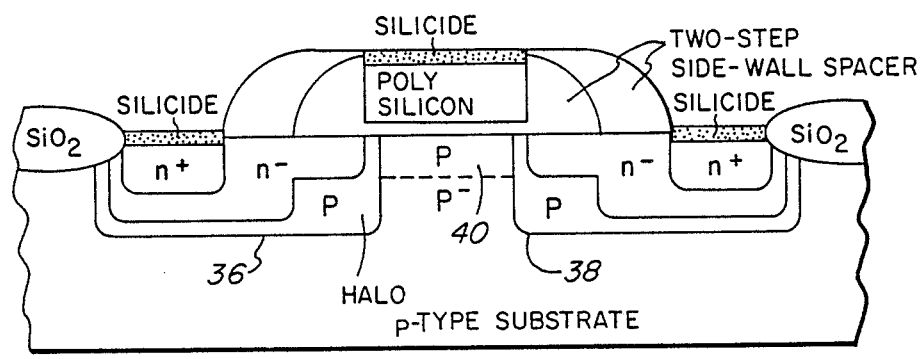
FIG. 2 is a similar view of another embodiment of the invention wherein a halo has been added over the sheaths and having threshhold control implants under the gate.

In FIG. 2, a modified structure is shown in which there is added a halo 36, 38 which in turn encases the sheath 20, 22. This halo is of a different conductivity type than that of the source and draim portions 12, 14. This embodiment also includes a threshold control implant 40 under the gate portion 10.

The lightly doped (n−) outer sheath 20, 22 and the n+ highly doped contact region 16, 18 of the source and drain portions 12, 14 can be produced by using a relatively deep n− and n+ implant. The lateral extent (along the channel length) of those regions is defined by the width of the sidewall oxide spacers 28, 30, 32, 34. The sidewall spacer oxide layers 28–34 are grown in two successive steps. The n− outer implant is performed after the first growth of the sidewall spacer layer 28, 32. The doping levels in the LDS are chosen depending upon the channel length and other device parameters. This is followed by a second growth of the sidewall oxide layers 30,34 to allow for n+ implant 16, 18. It is to be noted that the overall sidewall spacer width is the same as in conventional LDD-FETs.

Figure 3:
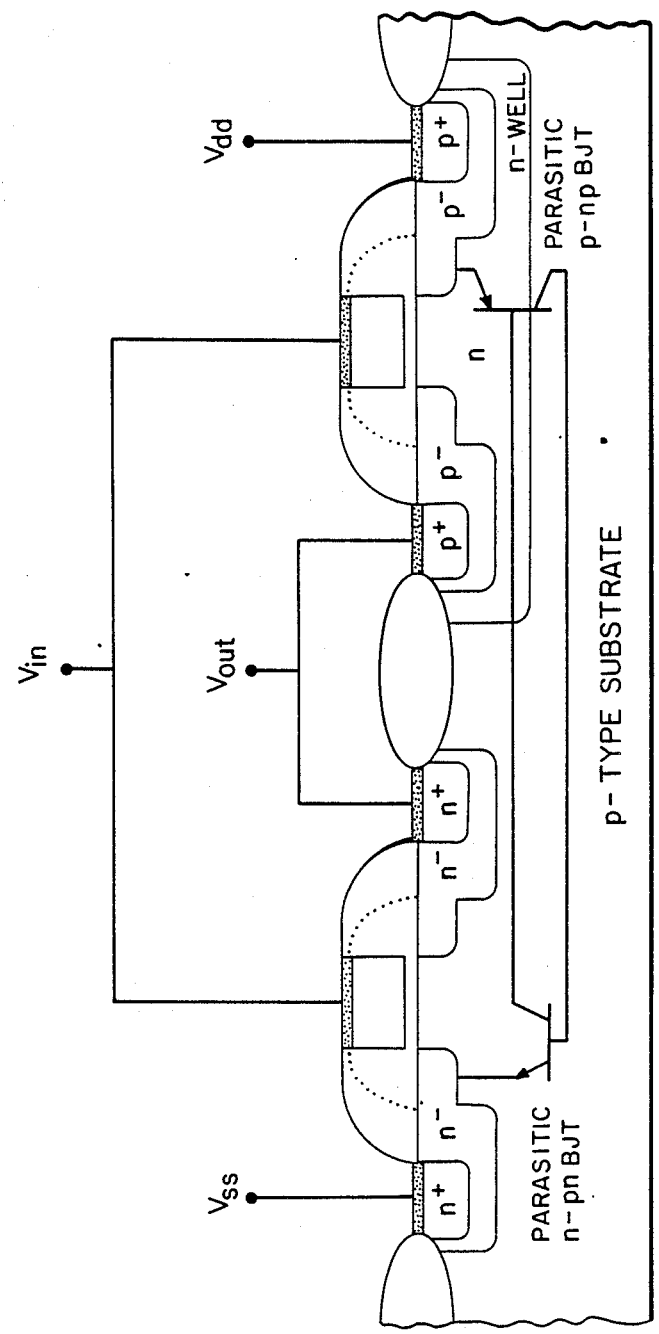
FIG. 3 is a schematic view of a CMOS using a pair of the field effect transistors of the present invention.

The transistors of the present invention exhibit improved latchup suppression due to the lightly doped sheath which reduces the influence of parasitic p-n-p-n structure(s). FIG. 3 shows the cross sectional schematic of CMOS invertor. The substrate and n-well contacts are not shown. In addition, shunt reisitors across the base-emitter junctions of the parasitic bipolar transistors (shown schematically) are not included. By incorporating n− (NMOS) and p− (PMOS) outer sheaths around drain/source regions in n− and p-channel LDD-FETs, an n−-p-n-p− parasitic device is realized rather than the conventional n+pnp+ parasitic structure. A analysis based on a simple two-transistor analog model reveals that the forward blocking characteristics of the n−-p-n− devices extend to much higher operating voltages due to reduced alpha (current gain) of its constituents n−-p-n− and p−-n-p− transistors. The reduction in a's is in turn, due to the poor injection efficiencies (gamma) of the n− and p− emitters in the CMOS structure.

The substrate current $I_{SUB}$ in n-channel MOSFETs is known to be caused by several phermoena including: (1) hole generation by hot channel electrons (near the drain) through impact ionization; (2) photogeneration of electron-hole pairs when photons (generated via Bremsstrahlung and other mechanisms) near the draim end are absorbed at places distant from the generation site; and (3) minority carrier injection from the source when the source-substrate junction becomes sufficiently forward, based, particularly when $$I_{SU}{}^{B*}R_{SUB}(V_{SUB}+0.65)$$

As the channel dimensions become shorter, the last mechanism described above becomes the dominant contributing factor of $I_{SUB}$ (as well as $I_{coll}$). Minority carriers injected into the substrate are collected as a leakage current $I_{coll}$ on nearby electrodes resulting in a regenerative bipolar action involfing an npn transistor (an open base device formed by the source, substrate, and drain regions). This leads to increased hole generation at the drain end, and in turn a higher $I_{SUB}$.

Drain-induced barrier lowering (DIBL) and punchthrough are important limiting mechanisms reducing channel lengths in MOSFETs. DIBL can cause surface and/or subsurface injection from the source. The exact site of carrier injection depends on many factors affecting the two-dimensional electric field distribution in a MOSFET. Both DIBL and punchthrough effects are adversely impacted by the onset of hot carrier generation.

From the foregoing detailed description and drawings, it can be seen that the transistors of the present invention exhibit good latchup suppression, reducded substrate current under high field conditions and improved punchthrough and draim induced barrier lowering. They may be produced relatively simply by varying known techniques to produce the lightly doped sheathing about the highly doped contact regions of the source and drain portions of he transistor.

Having thus described the invention, what is claimed is:

1. A silicon lightly doped field effect transistor having:
   (a) a central gate portion;
   (b) a source portion to one side of said gate portion and having a heavily doped contact section spaced from said gate portion, a sidewall spacer portion about said gate portion and between said gate portion and contact section, and a lightly doped sheath about the sides and bottom of said heavily doped contact section, said sheath extending to a first depth about the sides of and below said contact section and having an extension of lesser depth extending from below said spacer portion to said gate portion, thereby providing a stepped configuration in cross section; and
   (c) a drain portion to the opposite side of said gate portion and having a heavily doped contact section spaced from said gate portion, a sidewall spacer portion about said gate portion and between said gate portion and contact section, and a lightly doped sheath about the sides and bottom of said heavily doped contact section, said sheath extending to a first depth about the sides of and below said contact section and having an extension of lesser depth extending from below said spacer portion to said gate portion, thereby providing a stepped configuration in cross section, said sheaths having an impurity doping concentration $10^2-10^4$ lower than the impurity doping concentration in the heavily doped contact sections.

2. The transistor of claim 1 in which the lightly doped sheaths are of $n^-$ conductivity type and the heavily doped contact sections are of the $n^+$ type.

3. The transistor of claim 1 in which the lightly doped sheaths are of $p^-$ conductivity type and the heavily doped contact sections are of the $n^+$ type.

4. The transistor of claim 1 including a separate halo layer extending about and below each of said sheaths and of a conductivity opposite to that of said lightly doped sheaths.

5. A CMOS transistor pair structure comprising a spaced lightly doped field effect pair of transistors each having:
   (a) a central gate portion;
   (b) a source portion to one side of said gate portion and having a heavily doped contact section spaced from said gate portion, a sidewall spacer portion about said gate portion and between said gate portion and contact section, and a lightly doped sheath about the sides and bottom of said heavily doped contact section, said sheath extending to a first depth about the sides of and below said contact section and having an extension of lesser depth extending from below said spacer portion to said gate portion, thereby providing a stepped configuration in cross section: and
   (c) a drain portion to the opposite side of said gate portion and having a heavily doped contact section spaced from said gate portion, a sidewall spaced portion about said gate portion and between said gate portion and contact section, and a lightly doped sheath about the sides and bottom of said heavily doped contact section, said sheath extending to a first depth about the sides of and below said contact section and having an extension of lesser depth extending from below said spacer portion to said gate portion, thereby providing a stepped configuration in cross section, the lightly doped sheaths of one of said transistors being of $n^-$ conductivity type and $10^2-10^4$ lower in impurity doping concentration than the heavily doped $n^+$ sections, the lightly doped sheaths of the other of said transistors being of $p^-$ conductivity type and $10^2-10^4$ lower in impurity doping concentration than the heavily doped $p^+$ sections.

6. The transistor of claim 5 including a separate halo layer extending about and below encasing said sheaths and of a conductivity opposite to that of the lightly doped sheaths.

* * * * *